(12) United States Patent
Mistretta et al.

(10) Patent No.: US 6,630,828 B1
(45) Date of Patent: Oct. 7, 2003

(54) RAPID ACQUISITION MAGNETIC RESONANCE IMAGING USING RADIAL PROJECTIONS

(75) Inventors: Charles A. Mistretta, Madison, WI (US); Dana C. Peters, Washington, DC (US)

(73) Assignee: Wisconsin Alumni Research Foundation, Madison, WI (US)

( * ) Notice: Subject to any disclaimer, the term of this patent is extended or adjusted under 35 U.S.C. 154(b) by 0 days.

(21) Appl. No.: 09/600,433

(22) PCT Filed: Dec. 11, 1998

(86) PCT No.: PCT/US98/26523

§ 371 (c)(1),
(2), (4) Date: Jan. 10, 2001

(87) PCT Pub. No.: WO99/30179

PCT Pub. Date: Jun. 17, 1999

Related U.S. Application Data

(60) Provisional application No. 60/081,409, filed on Apr. 10, 1998, and provisional application No. 60/069,430, filed on Dec. 12, 1997.

(51) Int. Cl.⁷ ................................................. G01V 3/00
(52) U.S. Cl. ........................ 324/309; 324/307; 324/300
(58) Field of Search ................................. 324/309, 307, 324/312, 314, 300; 128/653.4; 600/410

(56) References Cited

U.S. PATENT DOCUMENTS 5,590,654 A * 1/1997 Prince ...................... 128/653.4

FOREIGN PATENT DOCUMENTS

| EP | 0073671 A | * | 9/1983 |
| EP | 0 132 975 A | * | 2/1985 |

\* cited by examiner

*Primary Examiner*—Edward Lefkowitz
*Assistant Examiner*—Brij B. Shrivastav
(74) *Attorney, Agent, or Firm*—Quarles & Brady, LLP

(57) ABSTRACT

High resolution and high speed MR imaging is provided for imaged objects in which the brightness of the imaged objects dominates the surrounding tissues by using sparse angular sampling and projection acquisition techniques. Individual objects throughout a large field of view are imaged at a rate and resolution normally associated with small field of view techniques. For applications such as angiography, artifacts associated with sparse angular sampling are acceptable. Volume images are acquired by combining sparsely sampled projection in two dimensions with weighted Fourier Acquisition in the third dimension.

9 Claims, 7 Drawing Sheets

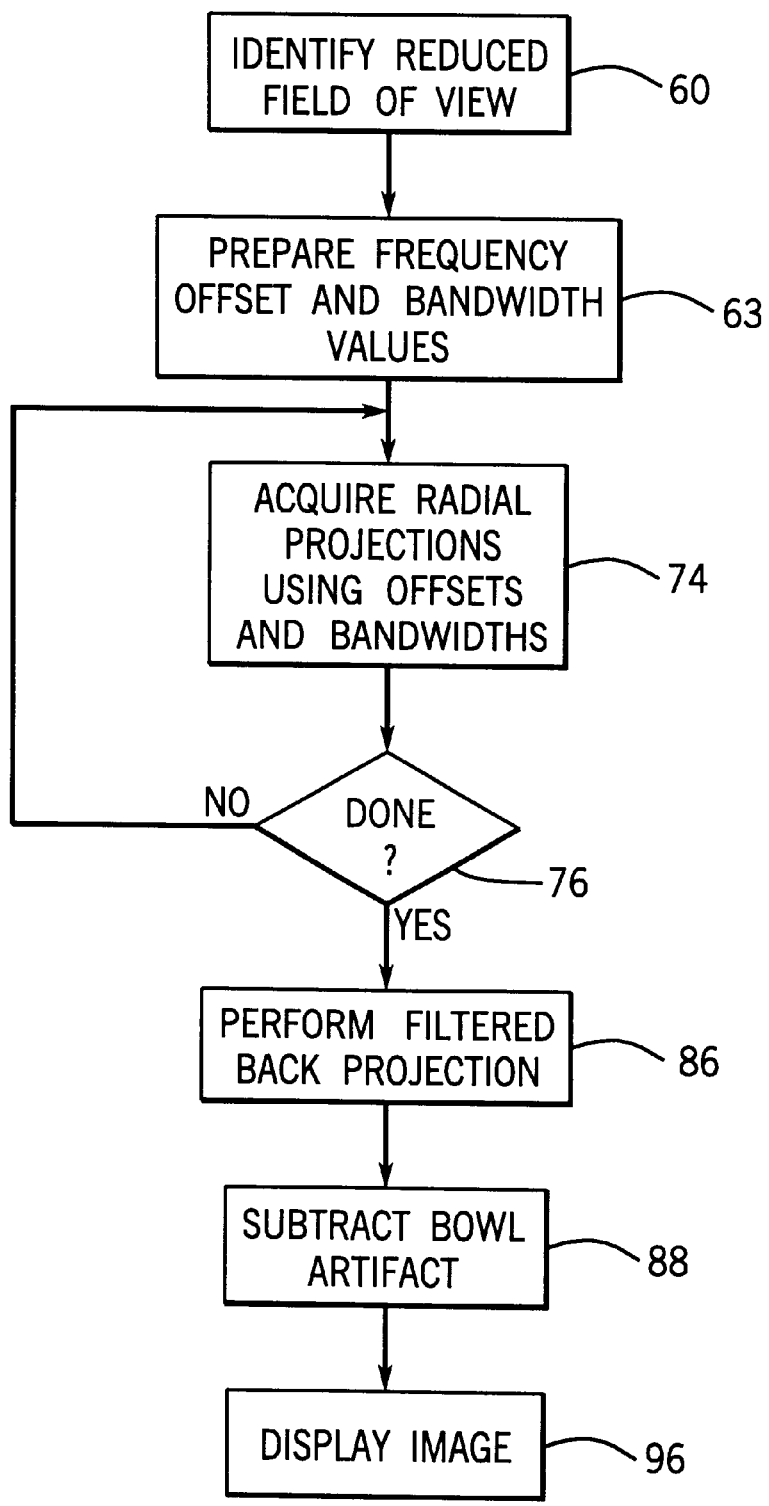

RAPID ACQUISITION MAGNETIC RESONANCE IMAGING USING RADIAL PROJECTIONS

CROSS-REFERENCE TO RELATED APPLICATIONS

This application claims the benefit of U.S. provisional application No. 60/069,430 filed Dec. 12, 1997 and U.S. provisional application No. 60/081,409 filed Apr. 10, 1998 both hereby incorporated by reference.

STATEMENT REGARDING FEDERALLY SPONSORED RESEARCH OR DEVELOPMENT

"This invention was made with United States Government support awarded by the National Institute of Health under grant NIH HL 52747. The United States has certain rights in this invention."

Background of the Invention

The field of the invention is magnetic resonance imaging ("MRI") methods and systems and more particularly a method and apparatus for rapidly acquiring MRI data from a portion of an imaged object.

MRI Imaging

When a substance such as human tissue is subjected to a uniform magnetic field (polarizing field $B_0$) the individual nuclei in the tissue attempt to align their magnetic moments with this polarizing field but as a result of nuclear spin, precess about it in random order at their characteristic Larmor frequency. The Larmor frequency is dependent on the strength of the magnetic field and on the properties of a particular nucleus as represented by a magnetogyric constant $\gamma$. Nuclei which exhibit this phenomenon are referred to as "spins".

By convention, the polarizing field $B_0$ is considered to lie along a z axis of a Cartesian coordinate system. The procession of the nuclei in the polarizing field $B_0$ creates a net magnetic moment $M_z$ in the direction of the polarizing field. Individual spins have magnetic moments that are perpendicular to the z axis in the transverse or x-y plane, however, the random orientation of the spins cancels any net transverse magnetic moment.

In MRI imaging, a radio frequency signal is applied in the x-y plane near the Larmor frequency to tip the net magnetic moment into the x-y plane so that it rotates at the Larmor frequency. The practical value of this phenomenon resides in the signal which is then emitted by the excited spins termed the NMR signal ("nuclear magnetic resonance"). In simple systems, the excited spins induce an oscillating sine wave in a receiving coil which may be the same coil used to excite the spins. The amplitude of this signal decays as a function of the homogeneity of the magnetic field caused by atomic scale interaction between the spins or "spin-spin" relaxation and the engineering limitations of producing a truly homogenous polarizing field $B_0$. This decay is caused by a loss of phase coherence in the spins and is commonly referred to as $T^*_2$ relaxation. Second decay mechanism is the gradual return of the magnetic moments of the individual spins to a longitudinal direction aligned with the polarizing field $B_0$. This is termed $T_1$ relaxation and in most substances of medical interest is much longer than $T_2$ relaxation.

An image of a patient may be obtained by evaluating the NMR signal contributed by different spins at different locations in the patient's tissue. A pulse sequence using gradient magnetic fields encodes location information on the spins in the form of the phase and frequency. The encoded spin signal may then be separated to produce an image.

A wide variety of pulse sequences is known. For example, the spin warp or spin echo technique is described in "Spin Warp NMR Imaging And Applications To Human Whole-Body Imaging" by W. A. Edelstein et al., *Physics in Medicine and Biology*, vol. 25, pp. 751–756 (1980); the steady state free precession ("SSFP") technique including gradient refocused acquired steady state pulse sequences ("GRASS") as described in U.S. Pat. No. 4,665,365 and contrast enhanced fast imaging (SSP-ECHO) described in "Rapid Fourier Imaging Using Steady State Free Precision", R. C. Hawks and S. Patz, *Magnetic Resonance in Medicine* 4, pp. 9–23 (1987); and echo planer imaging ("EPI") is described in an article by Peter Mansfield (J. Phys. C. 10: L55–L58, 1977). These descriptions of pulse sequences are hereby incorporated by reference.

Cartesian MRI Acquisition

In a representative spin echo pulse sequence, a z-axis gradient and a narrow-band, radio frequency excitation pulse may be applied to a patient, for example, so that only spins in a "slice" to the patient perpendicular to the z-axis are excited. An x-gradient field may then be applied to cause the spins at one side of the slice to precess faster than spins on the other side of the slice. In this manner, the spins have been given a frequency encoding that allows them to be distinguished along the x-axis.

This NMR signal of the spins at different frequencies is acquired for a period of time and digitized to provide a first row of data that may be stored in an array in a reconstruction computer. The number of dimensions of the array and the number of elements in the array define a k-space well known to those in the art. The NMR signals must be sampled at a rate at least twice the frequency of the highest frequency component of the NMR signal (the Nyquist sampling rate) so as to prevent the introduction of aliasing artifacts.

Additional NMR signals are then collected for this slice with the same x-gradient but with a progressively increased y-axis gradient field. The y-axis gradient serves to phase encode the spins in the y-direction. Each successive NMR acquisition with a different y-axis gradient forms a successive row in the k-space array in the computer.

Once k-space has been filled, a two dimensional Fourier transform may be made of the k-space data to produce the desired image. Generally it is known to band limit the NMR signal to eliminate the contribution of spins beyond certain spatial ranges in the frequency encoding x-axis direction limiting the amount of k-space data somewhat. Such band limiting cannot be performed in the phase encoding direction, however, until after the data is fully acquired and therefore is of little value in reducing the data acquisition time.

Radial MRI Acquisition

In an alternative method of data acquisition, the k-space data is filled not by rows and columns but by a series of radial projections about a point within k-space. This acquisition technique is analogous to the acquisition of data in an x-ray computed tomography ("CT") machine and allows the data to be reconstructed into an image by CT-type algorithms including filter back projection.

MRI Angiography

In MRI angiography, images of the blood vessels are obtained. For contrast-enhanced applications in which contrast materials such as gadolinium compounds are injected into a peripheral vein, the acquisition of k-space data must be carefully coordinated with the arrival of contrast so as to prevent an unfavorable variation in the weighting of the k-space data. The availability of a high speed imaging technique would be helpful in this regard since it would permit a series of images to be obtained throughout the passage of contrast.

In contrast enhanced MRI, two images, one before the introduction of a contrast medium into the vessels and one after the introduction of the contrast medium, may be obtained and subtracted. The subtracted image reveals information about the bloodflow through the vessels allowing the detection of obstructions and the like. Structures other than flowing blood are similar in the two images and thus substantially reduced in contrast.

The timing of the acquisitions of the two MRI images is crucial to providing a high contrast image. Normally there is a time delay between the introduction of the contrast medium into the patient and its time of arrival at the region of the vessel of interest.

Ideally the first image should be concluded immediately before the arrival of the contrast medium so as to provide an accurate comparison image and the second image begun immediately after the arrival of the contrast medium so as to be complete before the contrast medium dissipates The time consuming process of acquiring an image of a patient and the difficulty of monitoring the progress of the contrast medium, make production of a high quality contrast enhanced MRI image a difficult task.

Acquisition Speed

It would be advantageous to be able to acquire images of higher resolution more quickly. This is important when the available imaging time is limited by the passage of injected contrast material or by respiratory motion. In Cartesian acquisitions image spatial resolution is proportional to imaging time, so any reduction in acquisition time produces images of reduced spatial resolution. Within the context of Cartesian imaging, some investigators have developed methods to image reduced field of view. Reduction of the field of view reduces the amount of data required. Therefore, imaging time can be reduced. A disadvantage of this is that in Cartesian imaging objects from outside the field of view can appear inside the selected small field of view due to aliasing. In Cartesian imaging this aliasing results in an artifact which looks exactly like the object from outside the field of view. Although band limiting can be used to reject objects from outside the field of view in the frequency direction, this is not possible in the phase encoding direction because each row of phase encoding data relates to spins situated throughout the field of view.

One method of contending with this problem is the method of Hu and Parrish (X. Hu, T. Parrish, Reduction of FOV for dynamic imaging. *Magn. Reson. Med.* 31, 691 (1994). In this method, a preliminary image of the entire field of view is obtained. The portion of this image corresponding to the desired field of view is set to zero. Then the remaining data are subjected to a Fourier transformation to provide a k-space data set corresponding to just that material which might alias into the small field of view. During dynamic imaging of the small field of view, this k-space data set is subtracted from the data associated with the small field of view. This removes aliased signals from the small field of view, but only if the objects outside the small field of view are truly stationary.

In projection MRI acquisitions there is no phase encoding direction, as such, and it has therefore been proposed to use such an acquisition to limit the field of view thereby reducing acquisition time. Each projection is bandlimited to limit the inclusion of spins from outside the region of interest along the projection, however spins in regions perpendicular to the axis of projection cannot be so eliminated and produce image artifacts. These artifacts must be addressed by estimation techniques or supplementary measurements of the out of region areas for later cancellation. Such a technique is described in "Zooming by Back Projection" by K. Scheffler in the *Proceedings of ISMRM, Fifth Scientific Meeting and Exhibition, Vancouver. BC Canada,* Volume 1 page 288. Scheffler and Hennig (K. Scheffler, J. Hennig, Reduced circular field-of-view imaging. *Magn. Reson. Med.* 40, 474–480 (1998).) have applied the Hu/Parrish algorithm using projection acquisition. In this case, as in the Cartesian case, the imaging speed for a given resolution is increased. However, dynamic changes can only be viewed within the reduced field of view, and aliasing occurs if the outer material is not stationary. These techniques are limited by the fact that only a small field of view is acquired.

In projection imaging, the requirement that the angular sampling interval be equal to the radial sampling interval is that the number of projections NP is related to the number of radial samples NR by $$NP = NR \cdot \pi/2$$

This requirement poses an inherent time disadvantage for projection imaging relative to Cartesian imaging. The fact that it requires an additional factor of $\pi/2$ to acquire an image of the same resolution is one of the reasons that Cartesian acquisition is the primary method for magnetic resonance imaging in spite of the fact that the first MRI images in the mid 1970s were acquired with projection acquisition.

It is well known in the X-ray computed tomography literature, where projection acquisition is used, that acquisition time can be increased if sparse angular sampling is used. In this method the number of projections is decreased. It is also well known that as the number of angular samples is decreased, spatial resolution is not decreased but radial streak artifacts emanate from all objects within the field of view. In X-ray CT where bone provides a dominant signal which far exceeds the tissue signal differences to be distinguished, the presence of such artifacts is completely unacceptable. Up until this point in time, it has been assumed by the MRI community that such artifacts would be similarly unacceptable in magnetic resonance imaging if sparse angular sampling were to be used. Therefore, the small field of view techniques mentioned above have been resorted to in order to increase imaging speed in the limited number of situations in which the field of view can be compromised.

BRIEF SUMMARY OF THE INVENTION

The present inventors have recognized that when the NMR data is acquired in projection rather than Cartesian fashion the rate at which spatial resolution can be acquired is significantly increased. As can be inferred from X-ray computed tomography, spatial resolution is completely determined by the resolution in the readout direction within each projection and not by the number of acquired projections. As the number of projections is decreased, resolution is unaffected. The only effect is an increase in artifacts The artifacts generated by the sparse sampling in projection imaging are different from those generated in Cartesian acquisitions and can be readily tolerated in a number of important imaging applications.

Around each object within the overall field of view there is a small region (local field of view) in which the object does not produce any artifacts. The size of this artifact-free region does depend on the number of acquired projections. Outside of this small region each object does produce streak artifacts which can enter the local fields of view associated with other objects. The present inventors have recognized that these artifacts are typically no more than a few percent of the signal associated with the object producing them and that for applications such as angiography, pancreatography or bile duct imaging, where the signals of interest are the most dominant signals in the overall field of view, these artifacts appear to be completely tolerable. In such situations azimuthally undersampled projection imaging provides the speed and resolution advantages of reduced field of view imaging, but does so simultaneously throughout an entire large field of view. Preliminary results suggest that a speed increase of a factor of six is often possible.

Specifically, then, the present invention provides a method of MRI imaging of structures, the structures providing NMR signals with intensities dominating the intensity of other NMR signals of other materials within a field of view. The method includes the steps of generating a series of gradient fields along axes distributed over a range of angles about an axis in the field of view, then acquiring NMR signals of the field of view at different gradient fields, each acquisition providing an angular projection of data in k-space having data points radially spaced at distances and are along a projection. The number of acquisitions is limited to a number of projections less than $NR\pi/4$ in number (where NR is the number of radial samples) so that k-space is sparsely sampled. The projections are reconstructed to produce a field of the image of view displaying the entire field of view.

It is thus one object of the invention to provide a rapid NMR acquisition technique well suited to bright objects dominating other objects in the field of view. Such situations may include imaging blood vessels in angiography, or imaging the pancreas or liver ducts. The present invention provides a dynamic view of the entire field of view, not just the object.

The projection acquisition may be combined with a volumetric acquisition in which a phase encoding in gradient is applied along the axis during the acquisition of the NMR signals and a Fourier reconstruction is made along that axis to provide a volume image.

Thus it is another object of the invention to provide for the benefits of projection acquisition together with the benefits resulting from weighted k-space acquisition along the phase encoding gradient. As is known in the art, it is desirable to increase k-space sampling for lower k-space frequencies at the expense of higher k-space frequencies. Projection imaging does not allow such k-space weighting in the slice of the projection since each projection acquires data near the center of k-space. However, when combined with Fourier reconstruction in the volumetric axis, such weighting can be obtained. The phase encoding may be performed after a full set of projection images are obtained or may be performed in between each projection image. In this latter case, the projection angle selected may alternate between two or more interleaved sets so as to minimize the time required to obtain a sparse sampling of k-space yet to allow the more complete sampling as time permits.

In the case where the structure being imaged is smaller than a containing imaged object, the step of spatial saturation of two bands parallel to the gradient direction and separated by the intervening width of the structure may be included.

It is therefore another object of the invention to provide a method of suppressing the artifacts produced by sparse sampling with projection imaging.

During the acquisition of the NMR signals, a contrast medium may be introduced into a field of view and used to produce a contrast index indicating the arrival of a contrast medium in the structure. This contrast index may be displayed and/or used to select particular NMR signals for the generation of low and high contrast images. The low and high contrast images may be subtracted, for example, to perform subtraction angiography.

Thus it is another object of the invention to provide a real-time measure of contrast. The NMR signals acquired at each projection may be simply integrated to produce a contrast indication. The contrast indication may be weighted according to the particular angle so as to remove anatomical effects or when a comparison value is being produced, the comparison may be made only between corresponding angles.

The foregoing and other objects and advantages of the invention will appear from the following description. In this description, reference is made to the accompanying drawings which form a part hereof and in which there is shown by way of illustration a preferred embodiment of the invention. Such embodiment does not necessarily represent the full scope of the invention, however, and reference must be made therefore to the claims for interpreting the scope of the invention.

BRIEF DESCRIPTION OF THE SEVERAL VIEWS OF THE DRAWINGS

FIG. 6 is a flowchart describing steps executed by the processor of FIG. 1 in acquiring an image per the present invention;

DETAILED DESCRIPTION OF THE INVENTION

MRI System Components

Figure 1:
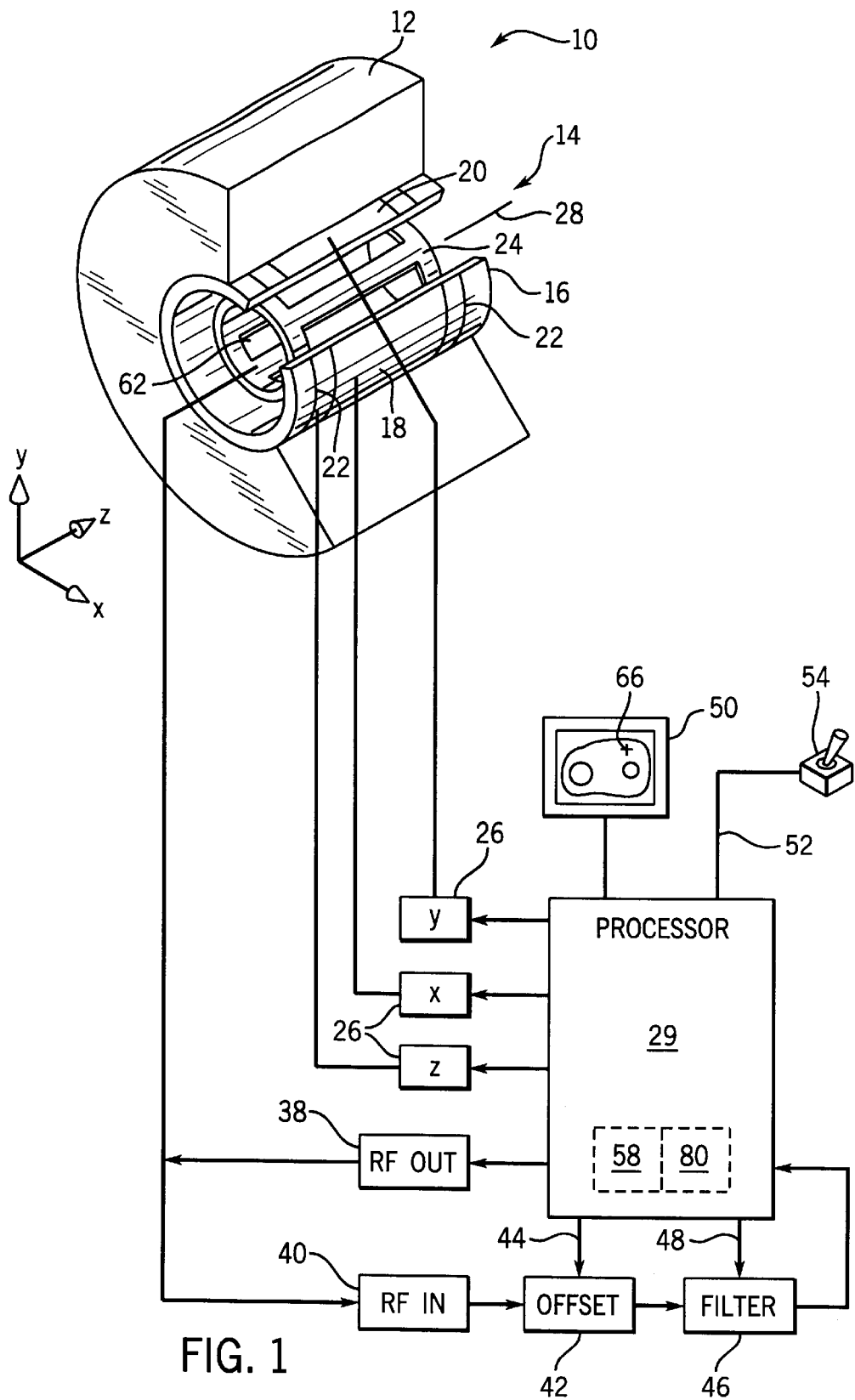
FIG. 1 is a simplified representation of an MRI scanner showing a polarizing magnet and three stationary orthogonal gradient coils aligned with the z-axis of a Cartesian coordinate system and attached to gradient amplifiers, the figure further showing RF transmission and receiving processing circuitry of the present invention controlled by and communicating with a processor having a display and a manual input device for setting a location of a region of interest.

An MRI system 10 of a type suitable for use with the present invention may include an annular superconducting magnet 12 providing a homogenous $B_0$ magnetic field along a z-axis within a central bore 14 of the magnet 12. The bore 14 may generally define a maximum field of view 62 of the MRI instrument.

Attached to a coaxial form 16 positioned within the bore 14 are x, y-and z-gradient coils 18, 20 and 22, respectively. These coils produce gradient fields also directed along the z-axis but having spatial gradation measured along the x, y-and z-axis respectively. An RF transmitting and receiving coil 24 is also positioned coaxially within the bore 14 to allow for excitation of the nuclear spins and a detection of the resulting NMR signal. The construction of magnet and coil structures as described is well known in the art and is intended to be only representative of a broad class of instruments.

Figure 2:
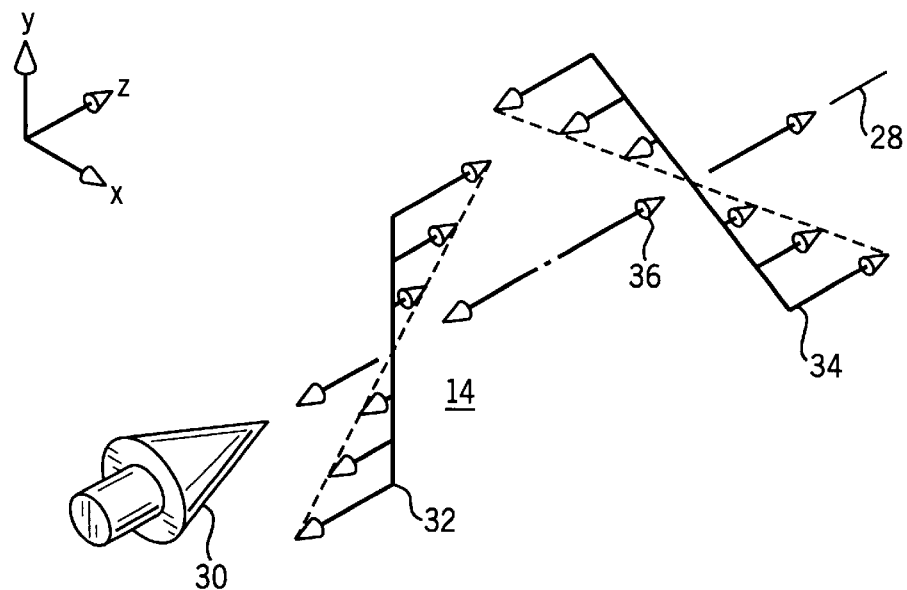
FIG. 2 is a perspective graphical representation of the polarizing magnetic field with respect to three orthogonal gradient fields as produced by the MRI scanner of FIG. 1.

Each of the gradient coils in x, y, and z is connected to a corresponding gradient driver circuit 26 that may receive commands from a central processor 29 so as to provide an electrical signal controlling the gradient produced by the coils 18, 20 and 22 both in time and amplitude. The gradient coils are fixed in relationship to the bore so that the magnetic gradient fields produced remain symmetrical about a bore axis 28, but the slope of the gradients is controlled by the gradient driver circuit 26. Thus, referring both to FIGS. 1 and 2, the superconducting polarizing magnet 12 produces a $B_0$ field 30 uniform across the x, y and z-axes within the field of view. A y-gradient 32 provides a magnetic field whose vectors are also aligned with the z-axis but which are directed counter to the $B_0$ field 30 at low y-axis values, with the $B_o$ field at high y-axis values, and which vary linearly between the two y-axis extremes. Likewise the x-gradient 34 and z-gradient 36 vary linearly between opposition and alignment with the $B_0$ field as one moves to higher x-and z-values. The zero point of the gradients is generally aligned with the bore axis 28 of the magnet 12.

Referring again to FIG. 1, also connected with processor 29 is an RF excitation circuit 38 which receives a control signal from the processor 29 to produce an RF excitation pulse to the RF coil 24 to excite spins of a patient or the like in bore 14 into resonance as has been described and as is generally understood in the art. After completion of the RF excitation pulse, one or more NMR signals may be acquired as received by the coil 24 through RF amplifier 40 as is understood in the art. The RF signal so received is processed by a programmable frequency offset circuit 42 which provides a heterodyning action to scale downward the frequencies in the RF signal by an offset amount 44 received from the processor 29. The NMR signals are next filtered by a programmable low-pass filter 46 which receives its filter break point 48 from the processor 29. The resulting NMR signal is then sampled and digitized and stored in memory in the processor 29 in an array as will be described below.

It will be understood that the programmable frequency offset circuit 42 and the programmable low-pass filter 46 may be realized as discrete electronic circuits or portions or all of these elements maybe realized in software as operations performed on the digitized and sampled NMR data according to techniques well know in the art. Likewise, the sampling rate may be realized after data acquisition at a higher sampling rate by an averaging of multiple samples into one or other similar techniques. Because the invention may be realized in software, no change in the hardware of the MRI scanner is needed. The order of the processing of the NMR signal by the programmable frequency offset circuit 42 and the programmable low-pass filter 46 can be reversed, but is preferably as shown for reasons that will become apparent.

The processor 29 receives the NMR data and reconstructs it into an image that may be displayed on a display 50. The processor also receives, among other control and console commands not described herein, a position signal 52 from a cursor control device 54 such as a mouse, track ball or joystick.

Reduced Field Projection Acquisition

While the present invention is not limited to imaging a reduced field of view and in fact provides a dynamic imaging of the entire field of view, the inventors have provided certain advances applicable also to reduced field of view imaging as will now to be described.

Figure 3:
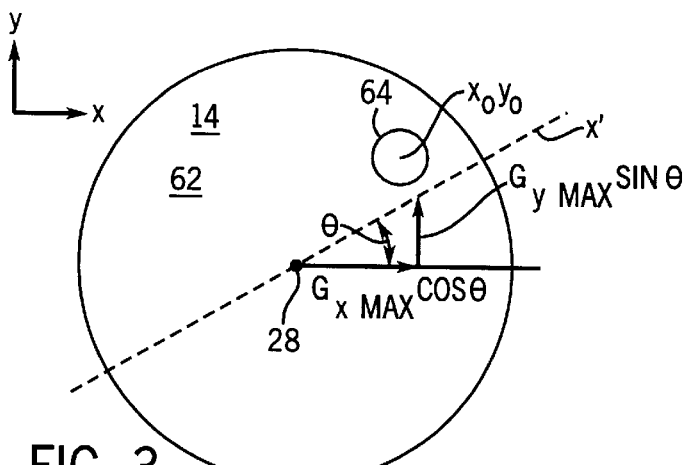
FIG. 3 is a schematic representation of an x-y plane through the bore of the magnet of FIG. 1 showing the generation of an arbitrarily angled gradient field along axis x' by means of a linear combination of the fixed x- and y-axis gradient fields.

Referring now to FIGS. 3 and 6, the processor 29 executes a stored program 58 contained in memory in order to acquire NMR data according to the present invention. In a first step of this program 58, indicated by process block 60, a region of interest 64 is identified within the maximum field of view 62 of the instrument. The maximum field of view 62 will generally be the entire portion of the bore 14 in which a patient or other imageable material is placed, whereas a region of interest 64 may represent a portion of a patient, for example a part of the colon, substantially smaller in area than the maximum field of view 62. The region of interest 64 may be offset from the bore axis 28 of the bore 14 in the x-and y-direction by amount $x_0$ and $y_0$. The region of interest 64 may be selected by a physician simply by knowledge of the coordinates of interest or interactively with the physician operating the cursor control device 54 to move a cursor 66 or the like on the display 50 where the display shows a previously obtained slice image of the patient or a similar schematic representation. The area and shape of the region of interest 64 may also be input by the physician. Typically, and as assumed herein, the region of interest 64 will be circular but it need not be.

Referring again to FIG. 6, after the region of interest 64 is identified both as to location and dimension, calculations for a set of radial gradient fields and associated offset frequencies and/or filter settings are generated as indicated by process block 63. During the acquisition of the image data, the radial gradients will be applied to the maximum field of view 62, including the region of interest 64 along axes x' at angles θ with respect to the x-axis. In the preferred embodiment, the radial gradients will be distributed over 180° at equal angular spacings and of a number determined by the size of the region of interest.

Each radial gradient may be generated by energizing at predetermined driving amplitude, one or more of the fixed gradient coils 22, 20 and 18. Thus referring to FIG. 3, a gradient along x' at an arbitrary angle θ may be produced by simultaneously energizing gradients x and y such that their relevant amplitudes $G_x$ and $G_y$ are according to the following equation:

$$G_y = G_{ymax} \sin(\theta)$$

$$G_x = G_{xmax} \cos(\theta)$$

where $G_{ymax}$ and $G_{xmax}$ are the maximum values of $G_y$ and $G_x$, respectively. Clearly gradients x' tipping out of the x-y plane may also be obtained by energizing the z-gradient for the acquisition of data in other planes than the x-y plane or in a volume rather than a slice.

Figure 4:
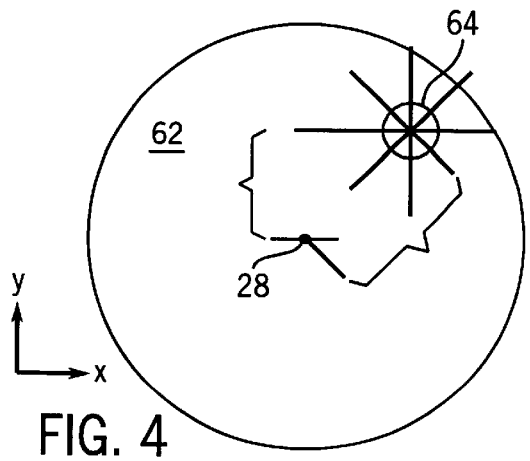
FIG. 4 is a figure similar to FIG. 3 showing multiple, angled gradient axes extending radially through a region of interest displaced from a magnet center.
Figure 5:
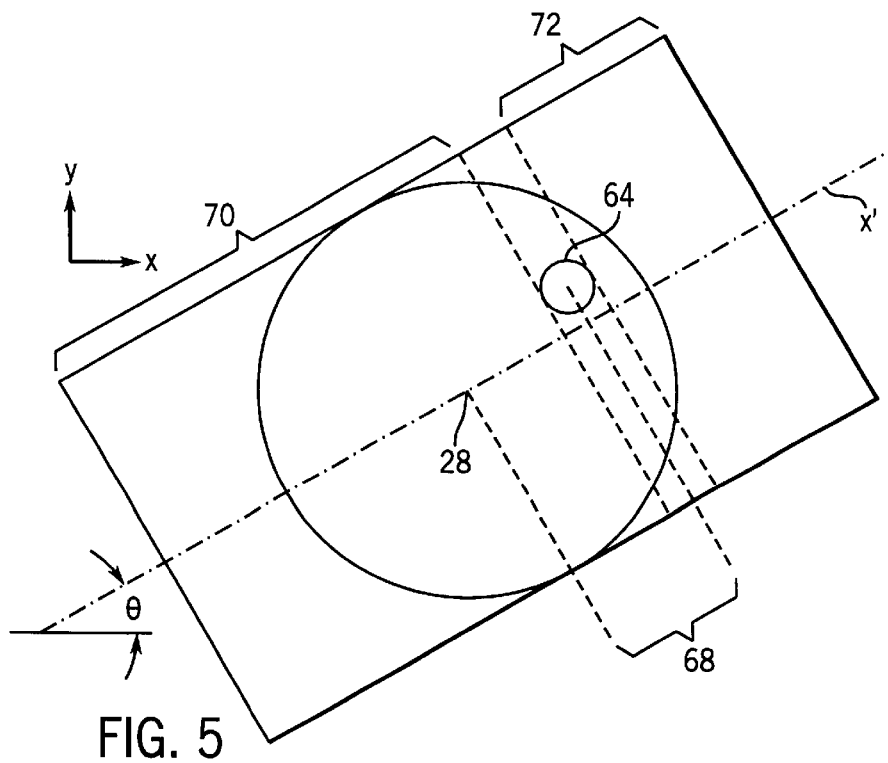
FIG. 5 is a figure similar to FIG. 3 depicting regions of frequency encoding along an axis x' and various dimensions relevant to the acquisition of NMR data from that field of view.

Referring now to FIG. 4, gradients x' distributed at angles about the bore axis 28 will also provide gradients oriented at these same angles about the center of the region of interest 64, albeit the zero point of the gradient fields will not be centered on the region of interest 64. Rather, referring to FIG. 5, for a given gradient along an axis x', the isocenter or zero point of the gradient (at bore axis 28) will differ by an amount 68 from the center of the region of interest 64 where the amount 68 causes a frequency offset in the acquired NMR signal as a function of θ as follows:

$$\text{Frequency offset}(x_0, y_0) = \gamma(G_{max}(y_0 \sin \theta + x_0 \cos \theta))$$

where $G_{max} = G_{ymax} = G_{xmax}$

Thus, the spins centered in the region of interest 64 will have a different frequency than the spins at the bore axis 28 depending on the angle θ at which the gradient x' is oriented. For this reason, the NMR signals acquired will be adjusted in frequency by this offset amount (that varies with θ) so that they may be properly combined for reconstruction.

Truncation of NMR Data Along x'

Referring again to FIG. 5, an NMR signal acquired with a gradient along axis x' will be frequency encoded by the composite x' gradient field. Thus, before the frequency shifting described above, spins for lower x' values 70 outside of the region of interest 64 will have a lower frequency and the spins for higher x' values 72 also outside of the region of interest 64, will have a higher frequency. After the frequency shifting described above, the lowest frequency spins will be in the region of interest 64 and the spin frequency in the lower x' values 70 and the higher x' values 72 will be equal and opposite in phase and higher in magnitude than the spins in the region of interest 64. Thus these spins may be removed with a low pass filter whose break-point is determined by the size of the region of interest 64. Prior to reconstruction or even sampling of the data (if a discrete rather than software filter is used), contributions from spins outside the region of interest 64 along the x' axis may be eliminated. The effective bandlimiting of the NMR data allows a lower effective sampling rate without aliasing and permits an improved signal to noise ratio in the sampled points 83.

Referring again to FIG. 6, the offset frequencies and filter breakpoint needed for each gradient at x' are thus computed at process block 63 prior to the generation of the gradients and acquisition of NMR data so that the acquisition of NMR data is not slowed by these calculations. It will be understood, however, that these computations may also be done during the acquisition of NMR data with suitably fast hardware.

Once the necessary offsets and breakpoints are determined, NMR data is acquired at each gradient angle θ and then shifted by the offset frequency by programmable frequency offset circuit 42 and filtered by the programmable low-pass filter 46, per the parameters previously determined as indicated by process block 74 and the loop of decision block 76. The acquisition is complete once NMR data has been obtained along each gradient axis x'.

Figure 8:
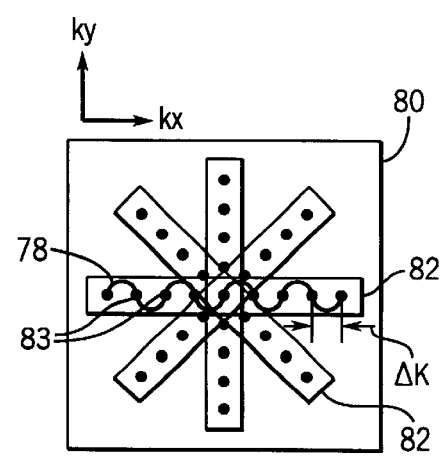
FIG. 8 is a figure similar to FIG. 7 showing NMR data acquired per the present invention as arranged in k-space.

Referring now to FIG. 8, the data of each NMR signal 78 is stored in an array 80 in memory of the processor 29 whose dimensions conform to k-space as is understood to those of ordinary skill in the art. Generally k-space differs from the Cartesian space of the bore 14 in that it is a spatial frequency domain rather than a time or position domain. The array 80 has rows of constant ky dimension and columns extending across the kx dimension. As each NMR signal 78 is acquired, it is stored in the array 80 at an angle from the kx axis corresponding to the angle that the gradient x' is to the x-axis. Thus, data fills the array 80 as a series of spoke-like projections 82 angled in k-space crossing rows and columns.

Figure 7:
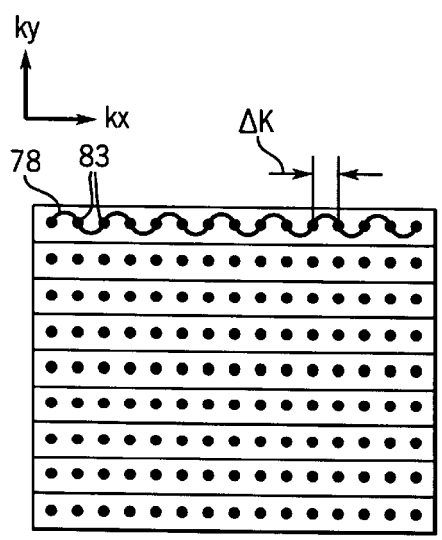
FIG. 7 is a representation of NMR data obtained in a prior art MRI scan arranged in k-space and as stored in an array in memory of the processor of FIG. 1.

Referring momentarily to FIG. 7, this radial acquisition is in contrast to a more typical filling of k-space on a row by row basis, each row representing the NMR signal 78, sampled at points 83, taken for a different phase encoding provided by the y-gradient.

Comparing these methods we note that there is a significant difference regarding the opportunity to exclude signals from unwanted regions. This has important consequences regarding signal to noise ratio, scan time or spatial resolution. When it is desired to obtain signals from a reduced field of view, it is necessary to worry about the extent to which signals associated with regions outside the field of view can alias into the desired field of view. In the conventional case employing rectilinear readout, temporal frequency filtering may be applied to the real-time readout signal to exclude signals outside a desired range of x-values, since x position is uniquely related to temporal frequency. However, since the y gradients are applied intermittently and are off during readout, there is no relationship between signal temporal frequency and y position. Therefore aliasing can occur in the y direction. In the case of projection reconstruction, the x' axis rotates and signals outside a given x'-range may be excluded. When the rotating saturation regions (described later in FIG. 13) are applied, aliasing from signals outside the desired field of view but within the limited spatial region(limited by the x' temporal filter) extending in the y' direction are also excluded. When small fields of view are successfully isolated, the k space step size may be increased (field of view=1/delta k). This means that fewer k-space steps are required to reach the edges of k-space. Because of this, readout of the signal using lower bandwidth can be employed to reduce noise. Therefore the more successful isolation of the small field of view using the described projection methods can be used to reduce noise. Optionally, if bandwidth reduction is not exploited, the same bandwidth can be used to reach the edges of k-space faster, resulting in reduced scan times, or for equal scan times, additional k-space data can be recorded, resulting in higher spatial resolution.

Referring again to FIG. 6, once a desired number of projections 82 have been acquired, the data may be reconstructed into an image by a number of techniques well known in the art of computed tomography ("CT") imaging. In the preferred embodiment, the reconstruction technique is "filtered back-projection" where a filter is applied to each projection 82 of data and it is back projected or "smeared" across the image plane to develop an image, a technique which is well known in the art. Alternatively, Fourier reconstruction techniques may be used in which points filling k-space are interpolated between the points 83 of the projections 82 and a two-dimensional Fourier transform performed. The reconstruction of the image is indicated at process block 86. The image is displayed on display 50 and may be superimposed on a template showing the larger field of view as has been described.

Spins Outside The Field Of View

Figures 9, 10, 11:
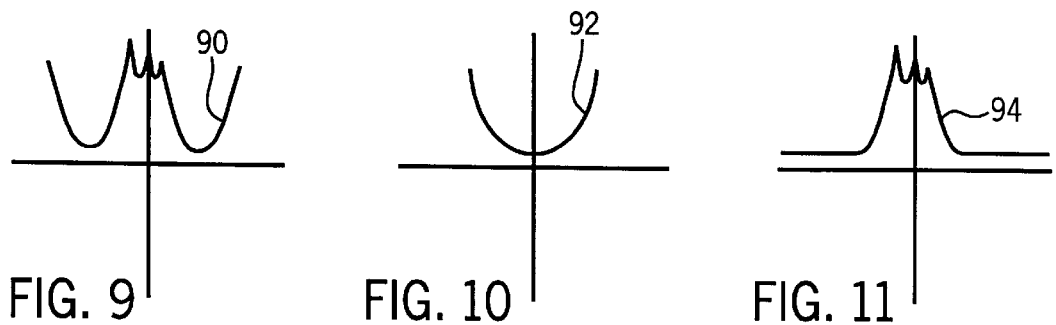
FIGS. 9, 10 and 11 are line graphs along lines through a reconstructed image from the data of FIG. 8 having respectively, an added bowl artifact, the bowl artifact in isolation, and the image data with the bowl artifact subtracted from it.

Although frequency filtering of the NMR signal eliminates the contribution to the acquired NMR signals of spins outside the region of interest 64 along the x' axis this is not true for spins displaced along the y' axis (perpendicular to the x' axis) outside the region of interest 64. These spins produce a bowl artifact in the reconstructed image. Referring to FIGS. 6 and 9, in a first embodiment, at next process block 88, a bowl artifact may be subtracted out from the image. The bowl artifact is a radially symmetric, generally upwardly concave offset centered in the image of the region of interest 64. The exact function of a bowl function will vary with the filter used for reconstruction and certain characteristics of the machine and image tissue but in a preferred embodiment is taken to be the following equation:

$$I_{bowl}(r) = I_{ring}(R-r+1)^{-0.68} + (R+r-1)^{-0.68}$$

where $I_{bowl}$ is the bowl artifact;

$I_{ring}$ is the intensity of the image at the edge of the reduced field of view;

R is the radius of the field of view; and r is the distance from the center of the region of interest.

By subtracting the bowl artifact 92 from the reconstructed image 90, a pure image 94 is obtained which may then be displayed as indicated by process block 96.

Spin Suppression

Figure 12:
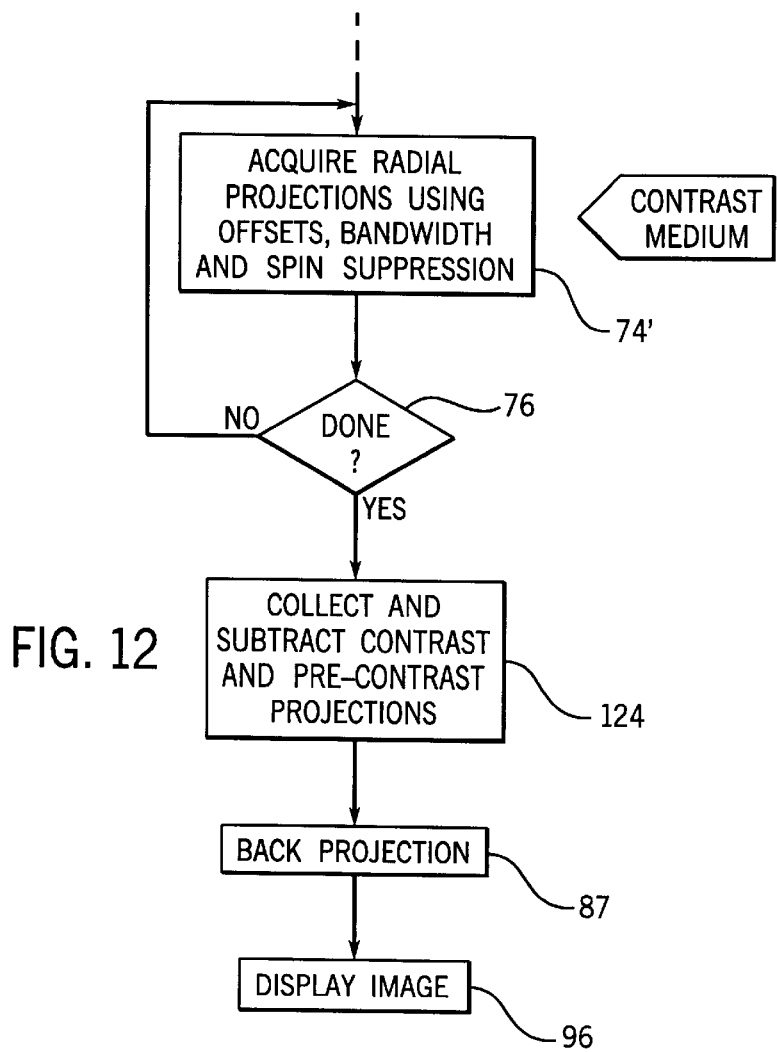
FIG. 12 is a figure similar to that of FIG. 6 showing an alternative embodiment using spin suppression to reduce image artifacts and/or image subtraction.
Figure 13:
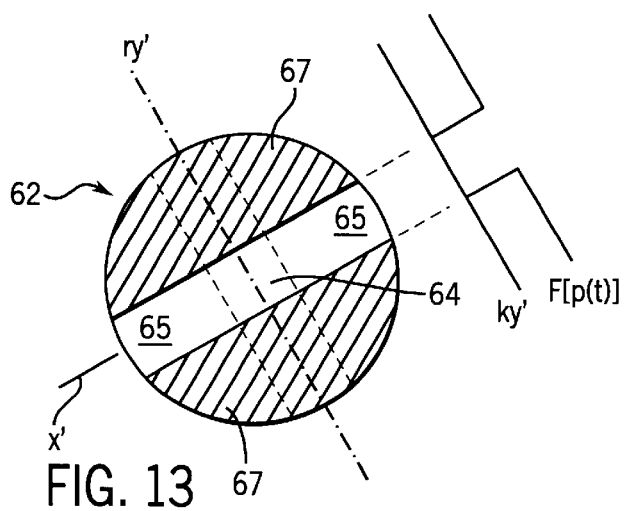
FIG. 13 is a figure similar to that of FIG. 4 showing regions of spin suppression and the Fourier transform of a spin saturation RF pulse used for spin suppression.

Referring now to FIGS. 12 and 13, in an alternative embodiment, the bowl image artifact is reduced by the suppression of spins outside the region of interest 64. At process block 74' corresponding generally to process block 74 previously described, a saturation pulse sequence shown in FIG. 14 and to be described, saturates and dephases spins of the maximum field of view 62 for values along the y' axis outside the region of interest 64. These saturated and dephased regions 67 are as indicated by the cross hatching and rotate with the rotation of the x' axis during acquisition. Through this technique, spins outside of the region of interest 64 that are aliased into the image of the region of interest 64 are reduced. The combination of saturated and dephased region 67 and the frequency filtering which eliminates the contribution of spins from regions 65 along the x' axis outside region of interest 64, substantially eliminates such aliasing.

Figure 14:
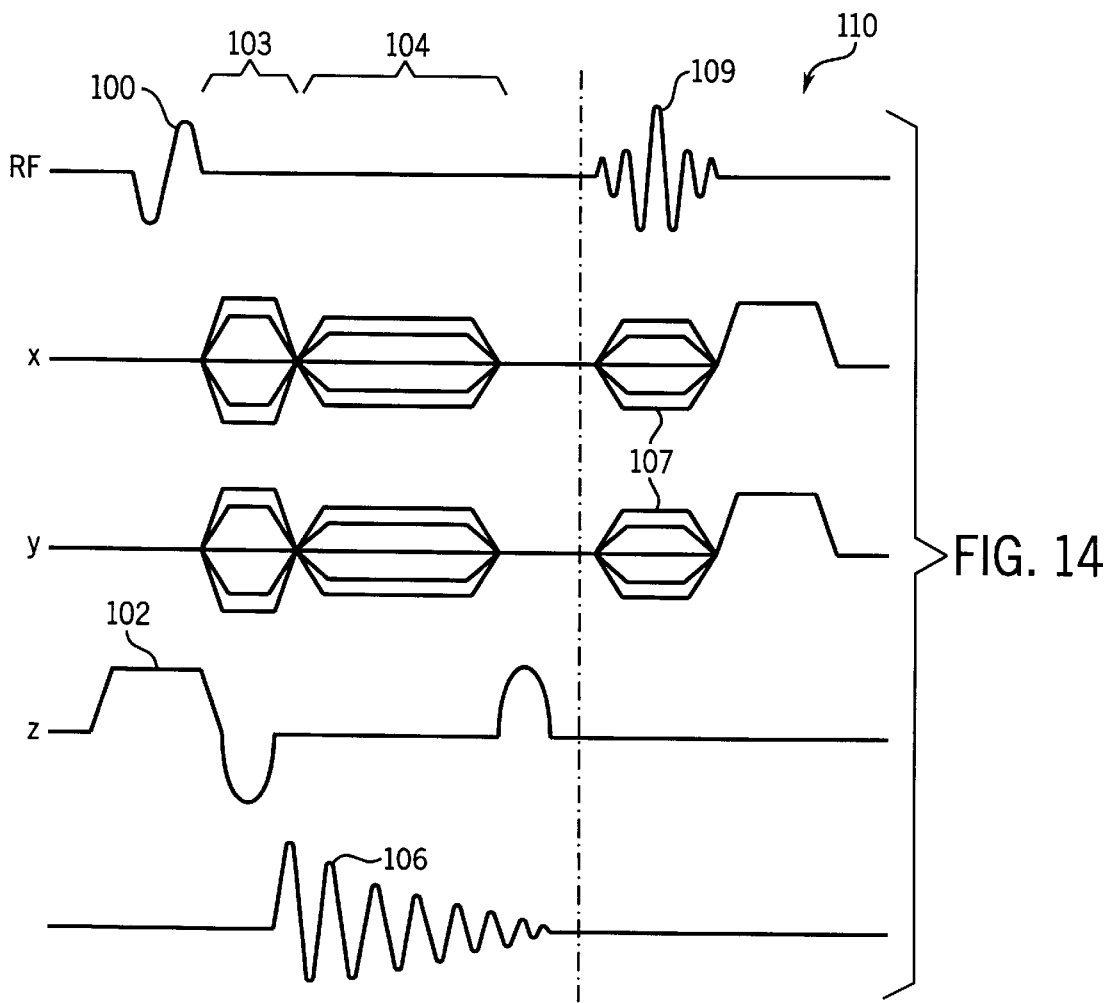
FIG. 14 is a graphical representation of a gradient sequence suitable for the spin suppression of FIG. 13 and the acquisition of NMR data.

Referring to FIG. 14, one example of a pulse sequence for accomplishing the spins suppression described above excites the spins in a single z-axis slice using RF pulse 100 during the application of z-gradient 102 used to select the slice. After x and y gradient prewinder pulses and a z gradient rewinder pulse 103, a combination of x and y gradients 104 may be applied to generate the x' axis as previously described along which an NMR signal 106 will be obtained. The NMR signal 106 provides a first projection 108 as shown in FIG. 15 and the data of a first projection 82 shown in FIG. 8.

Figure 15:
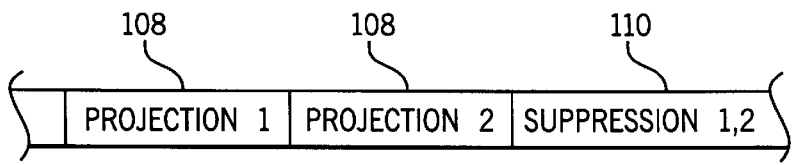
FIG. 15 is a schematic representation of a series of acquisitions per the gradient sequence of FIG. 14.

Generally, as shown in FIGS. 14 and 15, after one or more projections 108 are obtained, a suppression pulse sequence 110 is performed. In the suppression pulse sequence 110, the x and y-gradient fields are switched to values 107 to produce a gradient along the y' axis generally perpendicular to the next anticipated x' axes at which NMR signals 106 will be obtained. Referring also to FIG. 13, at this time a Hadamard RF pulse 109 is generated to excite spins only in the dephased regions 67 so that their moments are precessing in the x-y plane. The Hadamard pulse 109 is a combination of frequencies p(t) which in combination with the gradient along y' do not excite the spins within the region of interest 64 along the y' axis as will be understood to those of ordinary skill in the art. Following the Hadamard RF pulse 109, the x and y-gradients are set to arbitrary values to cause a dephasing of the spins in dephased regions 67.

A suppression pulse sequence 110 need not be performed after every acquisition of data as only a very small wedge of unsuppressed spins outside the region of interest 64 will occur with incremental changes in the advancing of the x' axis, and this wedge of spins may be ignored in favor of faster data acquisition.

Entire Field Projection Acquisition

As mentioned, the present invention is preferably not limited to imaging a reduced field of view but instead provides a dynamic imaging of the entire field of view. Referring again to FIG. 6, in the present invention, blocks 60 63, and 80 may be eliminated and a set of acquisitions may be acquired along projections per process block 74 with bandlimiting only to the extent normally done in Cartesian acquisitions so as to admit spins from the entire field of view. The number of projections is limited to a number that provides a sparse sampling in k-space. Referring to FIG. 8, the present invention contemplates that the number of projections 82 is limited to an amount in number less than NRπ/4 where NR is equal to the number of samples in each projection. Artifact free projection imaging would normally be expected to use NRπ/2 projections. The present inventors have recognized that this sparse sampling does not decrease the resolution of the image appreciably but simply creates image artifacts. As a result, there is no need to limit the field of view because the entire field of view can be imaged at essentially no additional cost in time. The invention thus provides a dynamic view of the imaged object outside the region of interest such as may be important of the physician.

Further, the image artifacts are of a type that may be accommodated in a variety of important imaging applications as they are displaced outside of bright objects (with strong NMR signals). Accordingly, in applications like angiography, where the bright vessels dominate the signals from surrounding tissue, the image artifacts are acceptable being outside of the structures (i.e., the blood vessels) of interest. Artifacts from nearby tissues which are not as bright but would overlap the blood vessels, are overwhelmed by the signal from the vessels themselves. Similar imaging applications are imaging of the ducts of the pancreas in a choloangiopancreatographic image or ducts of the liver.

Subtraction Studies

Figure 16:
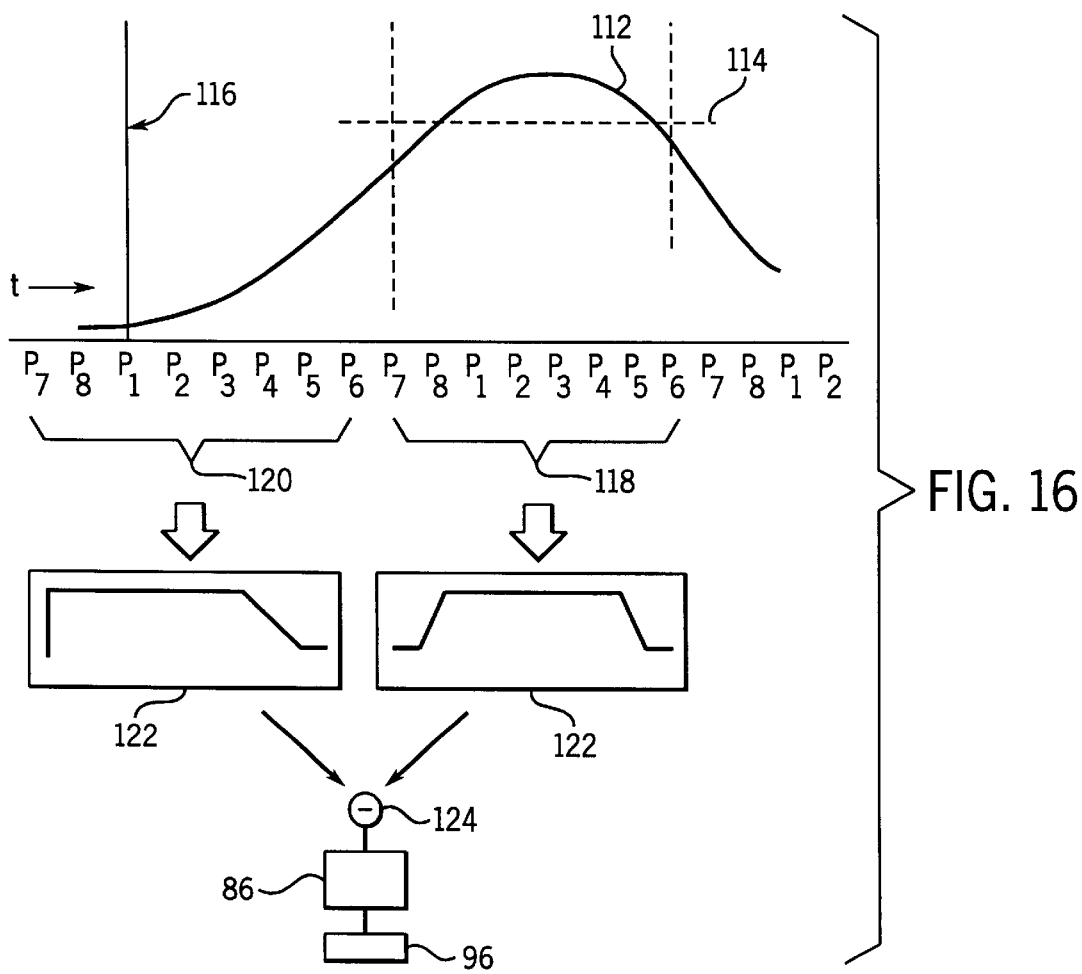
FIG. 16 is a combination time graph of contrast produced by an injected contrast medium and of NMR data acquisition in subsets according to the present invention; and a schematic representation of the collection of the subsets into subtractable images.

Referring now to FIGS. 12 and 16, the projection imaging of the present invention may be used in subtraction-type studies, such as those using a contrast medium injected into blood vessels. As is understood in the art, in such subtraction imaging, a "pre-contrast" image is first obtained of the region without the injected contrast medium followed by a "contrast" image of the same region after the contrast medium has infused into the structure of interest. The two images are then subtracted on a point by point basis to reveal an image principally of the contrast medium infused structure.

The process of subtraction tends to remove artifacts generated by spins outside of the region of interest 64 or by sparse sampling which remain the same in the two images and thus provides further reduction of image artifacts.

Referring now to FIG. 16, a contrast medium may be injected into the patient at a time 116 and there may be a unpredictable delay before a desirable contrast level 114 is reached. Generally too, the amount of time during which desirable contrast 114 is maintained may be less than the time required to obtain a full set of projections 82. In the present invention, a complete projection set may be acquired on an after-the-fact basis as will now be described.

As is well understood in the art, a projection set capable of reconstructing an image ideally includes a large number (e.g., 128) of projections 82 uniformly distributed in angle about the patient.

Figure 17:
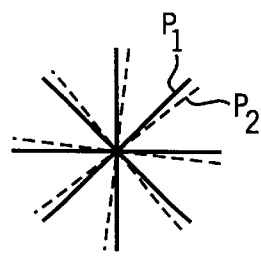
FIG. 17 is a schematic representation of the division of a projection set of NMR data into the subsets of FIG. 16.

Referring to FIG. 17 in a preferred embodiment, the projection set is divided into subsets of projections 82 according to angles of axis x'. Thus for example, if the projection set includes 128 projections 82 acquired along x' axes differing by substantially 2.8 degrees, these projections 82 may be divided into eight projection subsets p1 through p8. Projection set p1 may include projections 82 at angles θ of 8N(2.8), where N is an integer from 0 to 15. Similarly, projection subset p2 may include projections at angles θ of (8N+1)(2.8) and so forth.

Projection subsets p1 through p8 are acquired in sequence starting before the injection time 116 of the contrast media and continuing until a fall off of contrast 112. Each projection subset as so divided provides a good angular dispersion of projections 82 and on an after-the-fact basis, a contrast set of projections 118 including of eight contiguous projection subsets may be selected centered about the period of optimal contrast level as will form the contrast image. Note that the contrast set of projections 118 need not begin with projection subset p1.

Alternatively, the projection subsets p1–p8 may simply be sets of sequential adjacent projections 82, however, the good angular dispersion will not then be obtained, such as may reduce motion and other types of artifacts. Immediately prior to this contrast set of projections 118, a second pre-contrast set of projections 120 may be collected representing a pre-contrast image of the patient.

Optionally each of these projection sets 120 and 118 may be weighted by weighting functions 122 which reduce the contribution of projection subsets as a function of their time of acquisition. For the contrast set of projections 118, the weighting is such as to reduce the contribution from projection subsets removed from the time of peak contrast 112. For the pre-contrast image projection subsets, the weighting may be such as to reduce the contribution from projection subsets beginning to exhibit additional contrast as a result of infusion of contrast medium.

The two projection sets 120 and 118 as weighted may then be subtracted as indicated by block 124 and a back projection 86 made of the subtracted image.

The contrast 112 may be monitored on a real-time basis by, after acquiring the NMR data for each projection 82, summing or integrating the kx' data associated with that projection after the kx' data has been transformed. This sum may be compared to a sum for the identical projection (having the same θ value) taken at a time prior to the injection of the contrast medium. The difference between these values indicates the contrast index 112 with a time resolution equal substantially to the time required to acquire each new projection set after the injection of the contrast medium. Analyses of the trending of the contrast 112 can be used to determined the appropriate collection of the projections into projection sets 120 and 118 and the appropriate weighting functions 122.

Alternatively a historical functional relationship of integrated kx' data to angle may be determined and used to weight the kx' data so that it may be compared to kx' data at different angles to deduce changes in contrast and trending prior to the repeating of a projection set. This contrast index value 112 may be displayed to the physician or used to select sets of projections for projections sets to be reconstructed.

Volume Acquisitions

Images may be constructed of a volume extending in the z direction by acquiring successive slices in z-axis, back projecting slice images, and combining several slices using Fourier transform techniques well known in conventional imaging. Alternatively, the projection acquisition of the present invention may be combined with z-phase encoding to distinguish the z-dimension, according to techniques well understood in the art. Two approaches may be used. In the first, a complete projection set or projection subset is acquired for each z encoding. This permits placing all the low spatial frequency z encodes near the peak of the contrast curve. In the second approach, the full range of z encodes is performed for each projection of the projection set or projection subset. This method allows the after-the-fact collection of projections into a projection set clustered about the peak of the contrast curve. Obviously combinations of these approaches may be used in which z-encodes occur between subsets of projections.

Figure 18:
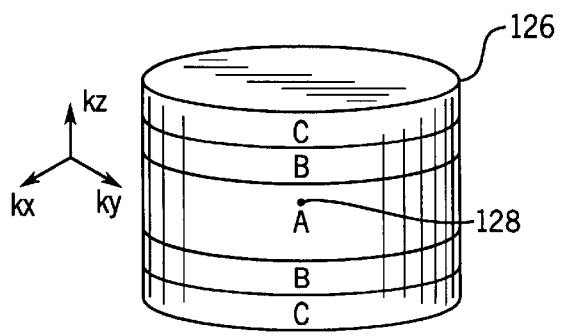
FIG. 18 is a perspective representation of a volume of acquired data in k-space showing the division of the volume into kz-axis regions.

Referring now to FIG. 18, in a third method, the amount of time required to acquire a volume of data encompassing several z-axis slices may be reduced by a k-space biased acquisition technique described in U.S. Pat. No. 5,713,358 issued Feb. 3, 1998 and entitled: METHOD FOR PRODUCING A TIME-RESOLVED SERIES OF 3D MAGNETIC RESONANCE ANGIOGRAMS DURING THE FIRST PASSAGE OF CONTRAST AGENT" naming a co-inventor of the present application, assigned to the same assignee as the present invention, and hereby incorporated by reference. This technique involves the repetitive acquisition of a volume 126 of data in k-space, for example, for the contrast measurement described above with respect to FIG. 16. The technique separately acquires k-space data in different z-axis bands, to obtain data in the kz-dimension near the origin 128 on a more frequent basis than data obtained away from the origin.

Thus, the k-space data may be divided into three regions differing in kz location. "A-data" is that in a band closest to the origin of k-space, "B-data" is removed from the origin on either side of the A-data, and "C-data" is removed even further from the origin to flank the B and A-data. The acquisition of data over a volume through z then follows the pattern of ABACABAC, etc. so that A data are preferentially obtained. This acquisition reflects a recognition that low frequency image data is relatively more important in contrast images then high frequency image data.

In acquiring data over a volume, the technique described with respect to FIG. 18 may be combined with the technique described with respect to FIG. 16 with each projection subset p being acquired over a volume piece-wise in the k-z dimension.

It will be understood from this description that the present technique may be used with a number of different types of pulse sequences and image acquisition protocols well known in the art but as applied to a radial acquisition as described. Thus, the technique may be used in a single slice with successive radial acquisitions or may be used in a volume of excited spins by tilting the spokes out of the x-y plane into the z-plane or may be used with z-phase encoding. Alternatively a volume of data may be obtained with a series of successive single slice excitations. In the situation, for example, where the image plane is aligned with the x-y plane and the field of view is moved in the z-direction a helical acquisition of data may be obtained in a manner analogous to that used in spiral or helical CT imaging. Thus, as motion is had in the z-direction, successive spokes may be obtained in a helical pattern with the 180° of spokes closest to the desired image plane being used to reconstruct the image or new spokes replacing old spokes as additional z-direction is reached. The spokes not lying in the image plane may be interpolated or extrapolated to the image plane as desired.

Further it will be understood that the above techniques associated with reduced field of view imaging and full field of view imaging maybe interchanged and that no element of these techniques not claimed should be considered critical to the invention.

The above description has been that of a preferred embodiment of the present invention. It will occur to those that practice the art that many modifications may be made without departing from the spirit and scope of the invention. In order to apprise the public of the various embodiments that may fall within the scope of the invention, the following claims are made.

We claim:

1. A method for producing a magnetic resonance angiogram of selected vasculature in a subject using a magnetic resonance imaging (MRI) system, the steps comprising:
   a) acquiring a mask image of the vasculature using the MRI system;
   b) introducing a contrast agent which flows into the selected vasculature;
   c) operating the MRI system to perform a pulse sequence which includes:
      i) producing an RF excitation pulse to excite spins in a field of view which includes the selected vasculature;
      ii) applying a phase encoding gradient along a first axis;
      iii) applying a radial gradient directed at an angle θ in a plane perpendicular to the first axis; and
      iv) acquiring an NMR signal during the application of the radial gradient to sample an angular projection of the data in k-space having data points radially spaced at distance NR along a projection;
   d) repeating step c) with a set of different phase encoding gradient values for each of a plurality of different radial gradient angles θ until k-space is sampled, wherein the plurality of different radial gradient angles θ is less than NR π/4 in number so that a sparsely sampled k-space data set is acquired;
   e) reconstructing an image of the selected vasculature from the sparsely sampled k-space data set; and
   f) subtracting the mask image from the image reconstructed in step e).

2. The method as recited in claim 1 in which the pulse sequence used to operate the MRI system in step c) is also used to acquire the mask image in step a).

3. The method as recited in claim 1 in which step d) is repeated to acquire a corresponding plurality of sparsely sampled k-space data sets during the passage of the contrast agent through the selected vasculature; and step e) includes combining k-space data from a plurality of said sparsely sampled k-space data sets.

4. The method as recited in claim 3 in which the phase encoding gradient values for encoding lower k-space frequencies are applied disproportionately more frequently than the phase encoding values for higher k-space frequencies during the acquisition of said plurality of sparsely sampled k-space data sets.

5. The method as recited in claim 3 in which the phase encoding gradient values for encoding for higher k-space frequencies are different in successive ones of said plurality of sparsely sampled k-space data sets.

6. A method for producing a magnetic resonance angiogram of selected vasculature in a subject using a magnetic resonance imaging (MRI) system, the steps comprising:
   a) introducing a contrast agent which flows into the selected vasculature;
   b) operating the MRI system to perform a pulse sequence which includes:
      i) producing an RF excitation pulse to excite spins in a field of view which includes the selected vasculature;
      ii) applying a phase encoding gradient along a first axis;
      iii) applying a radial gradient directed at an angle θ in a plane perpendicular to the first axis; and
      iv) acquiring an NMR signal during the application of the radial gradient to sample an angular projection of the data in k-space having data points radially spaced at distance NR along a projection;
   c) repeating step b) with a set of different phase encoding gradient values for each of a plurality of different radial gradient angles θ until k-space is sampled, wherein the plurality of different radial gradient angles θ is less than NR π/4 in number so that a sparsely sampled k-space data set is acquired;
   d) repeating step c) a plurality of times to acquire a corresponding plurality of sparsely sampled k-space data sets during the passage of the contrast agent through the selected vasculature, and wherein successive sparsely sampled k-space data sets sample different parts of k-space;
   e) combining k-space data from a plurality of said sparsely sampled k-space data sets acquired during a selected time interval during the passage of the contrast agent through the selected vasculature; and f) reconstructing an image of the selected vasculature using the combined k-space data from step e).

7. The method as recited in claim 6 in which the phase encoding gradient values for encoding for higher k-space frequencies are different in successive ones of said plurality of sparsely sampled k-space data sets.

8. The method as recited in claim 7 in which the radial gradient angles θ produced during the acquisition of each sparsely sampled k-space data set are different for successively acquired sparsely sampled k-space data sets.

9. The method as recited in claim 6 in which step e) includes weighting the k-space data differently for each of the plurality of sparsely sampled k-space data sets.

* * * * *